US008471733B2

(12) United States Patent
Wiley

(10) Patent No.: US 8,471,733 B2
(45) Date of Patent: Jun. 25, 2013

(54) TWO-WIRE CONNECTION TO A KEY MATRIX IN A MOBILE DEVICE

(75) Inventor: George Alan Wiley, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 813 days.

(21) Appl. No.: 11/680,036

(22) Filed: Feb. 28, 2007

(65) Prior Publication Data

US 2007/0290889 A1    Dec. 20, 2007

Related U.S. Application Data

(60) Provisional application No. 60/815,297, filed on Jun. 20, 2006.

(51) Int. Cl.
H03K 17/94     (2006.01)
H03M 11/00     (2006.01)

(52) U.S. Cl.
USPC .................................. 341/22; 341/20; 341/26

(58) Field of Classification Search
USPC .............................................. 341/20, 22, 26
See application file for complete search history.

(56) References Cited

U.S. PATENT DOCUMENTS

| 3,508,013 | A |   | 4/1970  | Monin          |         |
|-----------|---|---|---------|----------------|---------|
| 4,725,816 | A | * | 2/1988  | Petterson      | 341/24  |
| 5,274,371 | A | * | 12/1993 | Yang et al.    | 341/26  |
| 5,424,731 | A | * | 6/1995  | Kronberg       | 341/26  |
| 5,534,860 | A | * | 7/1996  | Phillips et al.| 341/22  |
| 5,872,561 | A | * | 2/1999  | Figie et al.   | 345/168 |
| 5,900,829 | A | * | 5/1999  | Gardner et al. | 341/26  |
| 5,929,790 | A | * | 7/1999  | Lim            | 341/22  |
| 6,509,846 | B1| * | 1/2003  | Fujiki         | 341/26  |
| 7,073,080 | B2| * | 7/2006  | Lou            | 713/320 |

(Continued)

FOREIGN PATENT DOCUMENTS

| JP | 61208115 A | 9/1986 |
| JP | 63055617 A | 3/1988 |

(Continued)

OTHER PUBLICATIONS

International Preliminary Report on Patentability—PCT/US07/071585—International Search Authority, European Patent Office—Sep. 1, 2008.

(Continued)

Primary Examiner — Hai Phan
Assistant Examiner — Amine Benlagsir
(74) Attorney, Agent, or Firm — Nicholas A. Cole

(57) ABSTRACT

A first current is driven through a first current path from a first common node, through a key matrix, and to a second common node when a key is pressed. A first measurement of the first current path resistance is made. A second current is then driven through a second current path from the second common node, through the key matrix, and to the first common node. A second measurement of the second current path resistance is made. The first and second measurements are used to identify the key that was pressed. Each key corresponds to a unique pair of first and second measurement values. In one example, non-linear resistance circuits are disposed at the ends of the row and column conductors of the key matrix such that a row resistor in the first current path is measured independently of a column resistor in the second current path.

28 Claims, 10 Drawing Sheets

U.S. PATENT DOCUMENTS

| | | | |
|---|---|---|---|
| 7,109,892 B2 * | 9/2006 | Owerfeldt | 341/22 |
| 7,256,714 B2 * | 8/2007 | Philipp | 341/33 |
| 7,612,690 B2 * | 11/2009 | Wright et al. | 341/26 |
| 2007/0290889 A1 * | 12/2007 | Wiley | 341/22 |
| 2008/0079610 A1 * | 4/2008 | Liao | 341/22 |

FOREIGN PATENT DOCUMENTS

| | | | |
|---|---|---|---|
| JP | 63206819 A | 8/1988 | |
| JP | 63211012 A | 9/1988 | |
| JP | 63211419 A | 9/1988 | |
| JP | 2205912 A | 8/1990 | |
| JP | 5313803 A | 11/1993 | |
| JP | 6036643 A | 2/1994 | |
| JP | 6150116 A | 5/1994 | |
| JP | 2001051774 A | 2/2001 | |

OTHER PUBLICATIONS

International Search Report—PCT/US07/071585, International Search Authority—European Patent Office, Feb. 28, 2008.

Written Opinion—PCT/US2007/071585, International Search Authority, European Patent Office, Feb. 28, 2008.

Taiwan Search Report—TW096122233—TIPO—Jan. 26, 2012.

* cited by examiner

| KEY PRESSED | RESISTANCE |
|---|---|
| "0" | 0R |
| "1" | 1R |
| "2" | 2R |
| "3" | 3R |
| "4" | 4R |
| "5" | 5R |
| "6" | 6R |
| "7" | 7R |
| "8" | 8R |
| "9" | 9R |
| "10" | 10R |
| "11" | 11R |
| "12" | 12R |
| "13" | 13R |
| "14" | 14R |
| "15" | 15R |

| KEY PRESSED | RESISTANCE | | | |
|---|---|---|---|---|
| | R -> C | (EXAMPLE) | C -> R | (EXAMPLE) |
| "0" | 0R' | 0K | 0R'+0R" | 0K |
| "1" | 1R' | 1K | 1R'+0R" | 1K |
| "2" | 2R' | 2K | 2R'+0R" | 2K |
| "3" | 3R' | 3K | 3R'+0R" | 3K |
| "4" | 0R' | 0K | 0R'+1R" | 10K |
| "5" | 1R' | 1K | 1R'+1R" | 11K |
| "6" | 2R' | 2K | 2R'+1R" | 12K |
| "7" | 3R' | 3K | 3R'+1R" | 13K |
| "8" | 0R' | 0K | 0R'+2R" | 20K |
| "9" | 1R' | 1K | 1R'+2R" | 21K |
| "10" | 2R' | 2K | 2R'+2R" | 22K |
| "11" | 3R' | 3K | 3R'+2R" | 23K |
| "12" | 0R' | 0K | 0R'+3R" | 30K |
| "13" | 1R' | 1K | 1R'+3R" | 31K |
| "14" | 2R' | 2K | 2R'+3R" | 32K |
| "15" | 3R' | 3K | 3R'+3R" | 33K |

(GAP arrows pointing to rows after "3", "7", and "11")

EXAMPLE $\begin{cases} R' = 1K \\ R" = 10K \end{cases}$

SMALLEST VALUE: 0R'
BIGGEST VALUE: 3R' + 3R"

FIG. 7

| KEY PRESSED | RESISTANCE | |
|---|---|---|
| | R -> C | C -> R |
| "0" | 0R' | 0R' |
| "1" | 1R' | 0R' |
| "2" | 2R' | 0R' |
| "3" | 3R' | 0R' |
| "4" | 0R' | 1R' |
| "5" | 1R' | 1R' |
| "6" | 2R' | 1R' |
| "7" | 3R' | 1R' |
| "8" | 0R' | 2R' |
| "9" | 1R' | 2R' |
| "10" | 2R' | 2R' |
| "11" | 3R' | 2R' |
| "12" | 0R' | 3R' |
| "13" | 1R' | 3R' |
| "14" | 2R' | 3R' |
| "15" | 3R' | 3R' |

SMALLEST VALUE: 0R'
BIGGEST VALUE: 3R'

| KEY PRESSED | RESISTANCE | |
|---|---|---|
| | R -> C | C -> R |
| "0" | 1R' | 1R' |
| "1" | 2R' | 1R' |
| "2" | 3R' | 1R' |
| "3" | 4R' | 1R' |
| "4" | 1R' | 2R' |
| "5" | 2R' | 2R' |
| "6" | 3R' | 2R' |
| "7" | 4R' | 2R' |
| "8" | 1R' | 3R' |
| "9" | 2R' | 3R' |
| "10" | 3R' | 3R' |
| "11" | 4R' | 3R' |
| "12" | 1R' | 4R' |
| "13" | 2R' | 4R' |
| "14" | 3R' | 4R' |
| "15" | 4R' | 4R' |

R1 = 1.0K OHM
R2 = 2.2K OHMS
R3 = 3.3K OHMS
R4 = 4.7K OHMS
R5 = 1.0K OHM
R6 = 2.2K OHMS
R7 = 3.3K OHMS
R8 = 4.7K OHMS
R9 = 10K OHMS

} 5% TOLERANCE RESISTORS

| KEY(S) PRESSED | RESISTANCE | | | |
| --- | --- | --- | --- | --- |
| | R -> C (MIN) | R -> C (MAX) | C -> R (MIN) | C -> R (MAX) |
| "0" | 864 | 955 | 864 | 955 |
| "1" | 1713 | 1893 | 864 | 955 |
| "2" | 2357 | 2605 | 864 | 955 |
| "3" | 3037 | 3357 | 864 | 955 |
| "4" | 864 | 955 | 1713 | 1893 |
| "5" | 1713 | 1893 | 1713 | 1893 |
| "6" | 2357 | 2605 | 1713 | 1893 |
| "7" | 3037 | 3357 | 1713 | 1893 |
| "8" | 864 | 955 | 2357 | 2605 |
| "9" | 1713 | 1893 | 2357 | 2605 |
| "10" | 2357 | 2605 | 2357 | 2605 |
| "11" | 3037 | 3357 | 2357 | 2605 |
| "12" | 864 | 955 | 3037 | 3357 |
| "13" | 1713 | 1893 | 3037 | 3357 |
| "14" | 2357 | 2605 | 3037 | 3357 |
| "15" | 3037 | 3357 | 3037 | 3357 |
| COL 1 AND COL 2 | 611 | 675 | | |
| COL 1 AND COL 3 | 677 | 748 | | |
| COL 1 AND COL 4 | 724 | 800 | | |
| COL 2 AND COL 3 | 1108 | 1224 | | |
| COL 2 AND COL 4 | 1238 | 1368 | | |
| COL 3 AND COL 4 | 1543 | 1705 | | |
| ROW 1 AND ROW 2 | | | 611 | 675 |
| ROW 1 AND ROW 3 | | | 677 | 748 |
| ROW 1 AND ROW 4 | | | 724 | 800 |
| ROW 2 AND ROW 3 | | | 1108 | 1224 |
| ROW 2 AND ROW 4 | | | 1238 | 1368 |
| ROW 3 AND ROW 4 | | | 1543 | 1705 |
| NO KEY PRESSED | 9500 | 10500 | 9500 | 10500 |

FIG. 14

TWO-WIRE CONNECTION TO A KEY MATRIX IN A MOBILE DEVICE

CROSS-REFERENCE TO RELATED APPLICATION

This application claims the benefit under 35 U.S.C. §119 of Provisional Application Ser. No. 60/815,297, filed Jun. 20, 2006, said provisional application is incorporated herein by reference.

BACKGROUND INFORMATION

1. Technical Field

The disclosed embodiments relate to key scanning, and more particularly relate to key scanning of key matrices having large numbers of keys.

2. Background Information

Cellular telephones have keys that a user can press to use and control the telephone. A circuit is needed to determine which one of the keys the user has pressed. FIG. 1 (Prior Art) is a simplified diagram of conventional cellular telephone key scanning circuitry. The circuitry includes a baseband processor integrated circuit 1 and a key matrix 2. Key matrix 2 includes multiple horizontally extending row conductors 3-6 and multiple vertically extending column conductors 7-10. A key is associated with each intersection of a row conductor and a column conductor. If a key is pressed by the user, then the corresponding row conductor is coupled to the corresponding column conductor. In operation, key scanning circuitry of baseband processor 1 scans through the row conductors, driving a signal onto each of the row conductors 3-6 one by one and detecting if the signal is present on any of the column conductors 7-10. If, for example, key 11 is pressed, then when baseband processor 1 drives row conductor 4 it will detect a signal on column conductor 8. The row conductor onto which the signal was driven and the column conductor upon which the signal was detected indicate which one of the keys was pressed. For cost reasons, it is desirable to reduce the number of terminals on the baseband integrated circuit 1. Reducing the number of connections between the baseband processor and the key matrix is therefore desirable.

FIG. 2 (Prior Art) is a simplified diagram of another conventional cellular telephone circuit. A dedicated key scan controller integrated circuit 12 performs the key scanning function and senses which one of the keys of key matrix 13 has been pressed. Key scan controller 12 then forwards information on which key was pressed via a serial connection 14 to baseband processor integrated circuit 15. Due to the serial interface between baseband processor integrated circuit 15 and key scan controller 12, the number of terminals on baseband processor integrated circuit 15 is reduced in comparison to the circuit of FIG. 1. A disadvantage, however, is that the key scan controller integrated circuit 12 is another integrated circuit that must be provided in the cellular telephone. Providing the additional integrated circuit, which is typically a microcontroller or a dedicated key scanning state machine, adds an undesirable and nontrivial cost to the cellular telephone.

FIG. 3 (Prior Art) is a simplified diagram of another conventional cellular telephone circuit. A separate discrete resistor is disposed between a first common node 16 and each of the row conductors 17-20 of key matrix 21. These separate discrete resistors are designated in FIG. 3 with reference numerals 22-25. Similarly, a separate discrete resistor is disposed between a second common node 26 and each of the column conductors 27-30 of the key matrix. These resistors are designated in FIG. 3 with reference numerals 31-34. A low-power resistance-change detecting circuit in baseband processor 35 monitors the matrix for a change in resistance between the first and second common nodes. If a change in resistance is detected, then the low-power resistance-change detecting circuit enables a more accurate sensing circuit. The more accurate sensing circuit measures the resistance between the SENSE+ and SENSE− terminals of the baseband processor integrated circuit 35. Each key when pressed results in a unique resistance between the SENSE+ and SENSE− terminals. Accordingly, the resistance measured by the accurate sensing circuit is used to identify the key that was pressed. For example, if key 36 is pressed, then row conductor 18 is coupled to column conductor 28 such that a total series resistance of 5R is present between the SENSE+ and SENSE− terminals of baseband processor integrated circuit 35.

FIG. 4 (Prior Art) is a table that shows the resistance between the SENSE+ and SENSE− terminals of the baseband integrated circuit 35 for each possible key that can be pressed. Note that the 5R resistance is unique and identifies the key pressed to be the "5" key 36.

A disadvantage of the circuit of FIG. 3 is that the total number of keys for which key presses can be sensed reliably is limited. Depending on the type of key matrix and on the types of resistors used and on the accuracy of the current measuring circuitry within baseband processor 35 and other factors, the maximum number of keys that can be reliably detected can be less than sixty, or can be less than fifty, and in some cases is around thirty. Some cellular telephones include more than thirty keys. For example, some cellular telephones include standard QWERTY keyboards involving approximately fifty keys. The circuit of FIG. 3 may not work well or at all with a key matrix having so many keys.

SUMMARY

A first current is driven through a first current path from a first common node, through a key matrix, and to a second common node when a key on the key matrix is pressed. A first measurement of an electrical characteristic is made during the flow of the first current. In one example, the resistance of the first current path is measured. Next, a second current is driven through a second current path from the second common node, through the key matrix, and to the first common node when the key is still being pressed. A second measurement of the electrical characteristic is made during the flow of the second current. In one example, the resistance of the second current path is measured. The first and second measurements are then used to identify the key that was pressed. Each key on the key matrix corresponds to a unique pair of first and second measurement values.

In some examples, non-linear resistance circuits are disposed at the ends of row and column conductors of the key matrix. An example of a non-linear resistance circuit is a resistor connected in parallel with a diode. Another example of a non-linear resistance circuit is a resistor connected in parallel with an appropriately controlled transistor. The non-linear resistance circuits are placed in the circuit such that when a first voltage polarity is present between the first and second common nodes and a key is pressed, then a first of the non-linear resistance circuits at the end of the row conductor has a very low resistance compared to a second of the non-linear resistance circuits at the end of the column conductor. By measuring the resistance of the first current path between the first and second common nodes during this first polarity condition, the resistance of the second non-linear resistance circuit is measured substantially independently of the first non-linear resistance circuit. The non-linear resistance circuits are placed in the circuit such that when a second voltage polarity opposite the first voltage polarity is present between the first and second common nodes and the key is still in the pressed condition, then the second non-linear resistance circuit has a very low resistance compared to the first non-linear resistance circuit. By measuring the resistance of the second current path between the first and second common nodes during this second polarity condition, the resistance of the first non-linear resistance circuit is measured substantially independently of the second non-linear resistance circuit. Because the resistances of the non-linear resistance circuits are measured independently of one another, a baseband processor integrated circuit that is coupled to the key matrix circuit by just two terminals (one terminal is coupled to the first common node, and other terminal is coupled to the second common node) can determine which single key was pressed on the key matrix.

The baseband processor integrated circuit is said to have a "two-wire connection" to the key matrix. By appropriate selection the values of the resistances and tolerances of the non-linear resistance circuits, the baseband processor integrated circuit can also detect when two keys on the key matrix are pressed simultaneously. In implementations involving no separate key scan controller integrated circuit, the two-wire connection reduces the number of terminals on the baseband processor integrated circuit that are required to perform the key scanning function from a large number as is conventionally required to interface to a large key matrix having many keys. The cost of the baseband processor integrated circuit may therefore be reduced because the number of terminals on the baseband processor integrated circuit package may be reduced. In one example, the non-linear resistance circuits are disposed on a novel integrated circuit that is a different integrated circuit than the baseband processor integrated circuit. The added novel integrated circuit adds cost to the mobile communication device, but that cost is less than the cost of providing a conventional dedicated key scan controller integrated circuit in the mobile communication device.

The foregoing is a summary and thus contains, by necessity, simplifications, generalizations and omissions of detail; consequently, those skilled in the art will appreciate that the summary is illustrative only and does not purport to be limiting. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 7 is a table that illustrates, for each key that can be pressed on the key matrix of FIG. 6, the corresponding resistances of the first and second current paths.

FIG. 14 is a table that illustrates the ranges of resistances of the first current path and the second current path for various key press conditions of the fourth example of a key scanning system of FIG. 12.

DETAILED DESCRIPTION

Figure 5:
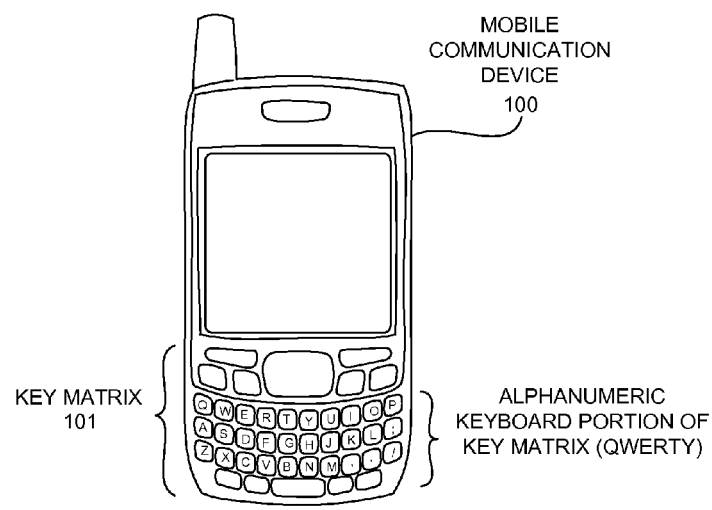
FIG. 5 is a diagram of a mobile communication device in accordance with one novel aspect.

FIG. 5 is a diagram of a mobile communication device 100. Mobile communication device 100 in this case is a cellular telephone. Mobile communication device 100 includes a key matrix 101. In the illustrated example, the key matrix 101 includes an alphanumeric keyboard portion as well as other keys. The alphanumeric keyboard portion has a QWERTY keyboard layout. The letters "QWERTY" designate the letters of the keys starting in the upper left of the alphanumeric keyboard portion and proceeding from left to right along to upper row of keys. In total, key matrix 101 includes alphanumeric keys and other keys for a total of more than forty keys.

Figure 6:
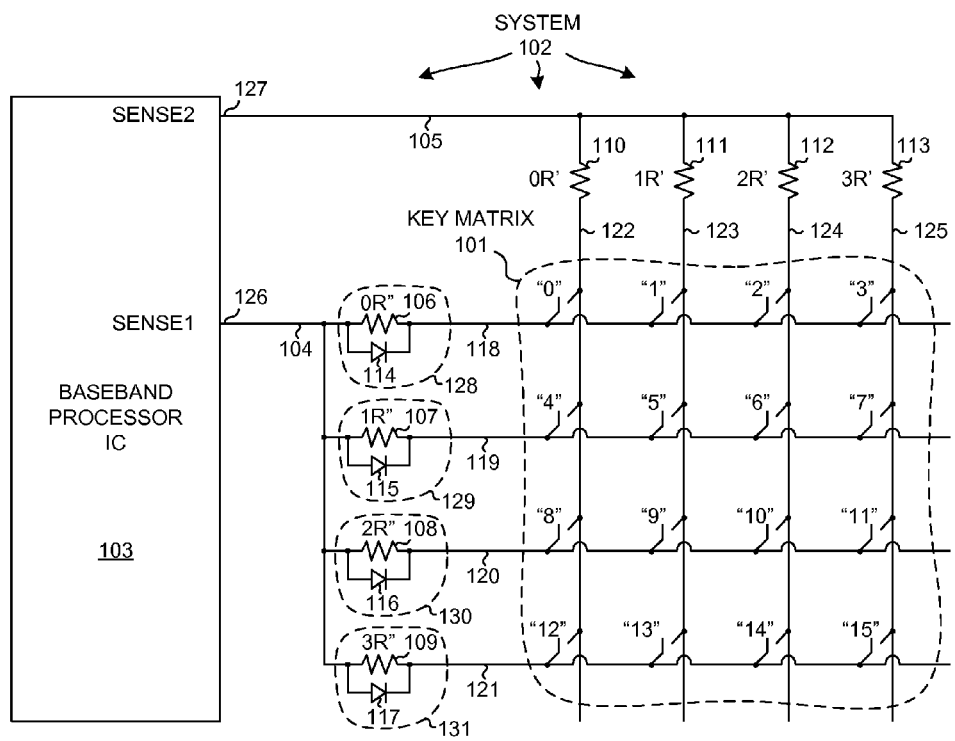
FIG. 6 is a diagram of a first example of a key scanning system within the mobile communication device of FIG. 5.

FIG. 6 is a simplified diagram of a first example of a key scanning system within mobile communication device 100 in accordance with a first novel aspect. Key scanning system 102 includes a baseband processor integrated circuit 103, a first common node 104, a second common node 105, eight resistors 106-113, four diodes 114-117, and key matrix 101. A resistor that is connected in parallel with a diode is one example of what is referred to here as a "non-linear resistance circuit." Reference numerals 128-131 identify four such non-linear resistance circuits. Baseband processor integrated circuit 103 may, for example, have an architecture of the MSM7600 baseband processor available from Qualcomm Incorporated of San Diego, Calif. Baseband processor integrated circuit 103 is coupled to key matrix 101 by what is referred to here as a two-wire key matrix interface.

Key matrix 101 includes four horizontally extending row conductors 118-121, four vertically extending column conductors 122-125, and sixteen keys. The terms "row" and "horizontally extending" and "column" and "vertically extending" are used here for conceptual purposes to simplify the explanation of the circuit. It is to be understood, however, that the actual row and column conductors can snake around and be oriented in any direction so long as the electrical connectivity of FIG. 6 is maintained. The sixteen keys are designated "0" through "15" in the diagram. Each key is disposed over a corresponding intersection of a row conductor and column conductor such that if the key is pressed, then the row conductor is coupled to the column conductor. For example, if key "5" is pressed, then row conductor 119 is coupled to column conductor 123. In the illustration, only sixteen keys of the many keys of key matrix 101 are illustrated due to limitations of space in the diagram. It is to be understood, however, that key matrix 101 has more than forty keys, and typically includes more than four row conductors and typically includes more than four column conductors.

In operation, a low-power sensing circuit within baseband processor integrated circuit 103 places a positive voltage on first common node 104 with respect to second common node 105. The low-power sensing circuit may, for example, involve a current supplying circuit that can drive a voltage onto the SENSE1 terminal and an analog comparator that can detect a change across a resistor in the current path of an incoming current received into the SENSE2 terminal. There are many suitable ways of realizing the low-power sensing circuit. For the vast majority of the time that mobile communication device 100 is operational, no key is being pressed. Accordingly, there is substantially no current flow from first common node 104 to second common node 105.

If, however, a key is pressed, then the low-power sensing circuit detects a current flow condition and activates a more accurate sensing circuit within baseband processor 103. The more accurate sensing circuit may, for example, involve digital logic, a current supplying circuit that can supply currents out of either the SENSE2 or SENSE1 terminals, a current mirror that mirrors a received current across a resistor, and an analog-to-digital converter that measures the voltage dropped across the resistor. There are many suitable ways of realizing the more accurate sensing circuit.

The more accurate sensing circuit first drives a first current from the SENSE1 terminal 126, through first common node 104, through the key matrix 101, through second common node 105 and to the SENSE2 terminal 127 of the baseband processor integrated circuit 103. Consider the situation in which the user of mobile communication device 100 presses key "5". The more accurate sensing circuit within baseband processor integrated circuit 103 drives a first current through a first current path from SENSE1 terminal 126, through first common node 104, through diode 115, onto row conductor 119, across the closed switch connection made by key "5", onto column conductor 123, through resistor 111, through second common node 105 and to SENSE2 terminal 127. Assuming for simplification purposes that diode 115 functions as an ideal diode that has no forward bias voltage drop and is forward-biased when its anode is positive with respect to its cathode, then diode 115 is forward-biased and no current flows through resistor 107. The total resistance of this first current path is therefore 1R'. 1R' is the resistance of column resistor 111. The more accurate sensing circuit within baseband processor 103 measures an electrical characteristic of this first current path. In one example, the electrical characteristic is a resistance and the sensing circuit determines that the resistance is 1R'. The resistance is measured by placing a known voltage (for example, 2.0 volts) between the SENSE1 and SENSE2 terminals, and measuring the current flow flowing between the two terminals.

After measuring the electrical characteristic of the first current path, the more accurate sensing circuit drives a second current through a second current path from SENSE2 terminal 127, through second common node 105, through resistor 111, onto column conductor 123, across the closed switch connection made by key "5", onto row conductor 119, through resistor 107, through first common node 104 and to SENSE1 terminal 126. Assuming again that diode 115 is an ideal diode, then diode 115 is reverse-biased and no current flows through diode 115. The resistance of this second current path is therefore 1R' plus 1R". 1R" is the resistance of resistor 107. The more accurate sensing circuit within baseband processor 103 measures an electrical characteristic of this second current path. In one example, the electrical characteristic is a resistance and the sensing circuit determines that the resistance is 1R' plus 1R". The resistance is measured by placing a known voltage (for example, 2.0 volts) between the SENSE2 and SENSE1 terminals, and measuring the current flow flowing between the two terminals.

The resistor values 106-113 are selected such that each pair of first and second current path resistances is unique. The sensing circuit uses the pair of measurement values to identify which one of the keys was the key that was pressed. Diodes 114-117 allow the resistances of the column resistors 110-113 to be measured without influence of the row resistors 106-109. The column resistors 110-113 have substantially smaller resistances than the resistances of the row resistors 106-109 so that when the second current is flowing from the second common node 105 to the first common node 104, the resistance of the second current path will be in a resistance range that identifies which particular row resistor is conducting the second current. The resistance of the second current path will be in this resistance range regardless of which column resistor is conducting the second current.

FIG. 7 is a table that illustrates, for each key that can be pressed on key matrix 101 of FIG. 6, the corresponding resistances of the first and second current paths. Note, for example, that FIG. 7 indicates that if the "5" key is pressed then the first current path has a resistance of 1R' and the second current path has a resistance of 1R' plus 1R". In the table, "R->C" designates current flow from a row conductor to a column conductor and "C->R" designates current flow from a column conductor to a row conductor. Table 7 sets forth current path resistances for an example in which R' is 1K ohms and R" is 10K ohms. Note that first current path resistance values are 0K ohms, 1K ohms, 2K ohms and 3K ohms. The current sensing circuit needs to be able to distinguish four different resistances in order to determine which of the column resistors is involved in the first current path. Note that the second current path resistance values are grouped in four groups. The first group (0K ohms, 1K ohms, 2K ohms and 3K ohms) is separated from the second group (10K ohms, 11K ohms, 12K ohms and 13K ohms) by 7K ohms. Similarly, the second group is separated from the third group (20K ohms, 21K ohms, 22K ohms and 23K ohms) by 7K ohms. Similarly, the third group is separated from the fourth group (30K ohms, 31K ohms, 32K ohms and 33K ohms) by 7K ohms. Accordingly, the current sensing circuit needs to be able to distinguish four different resistance ranges in order to determine which of the four row resistors is involved in the second current path. By making R" much larger than R', the gaps between the four resistance ranges can be made larger thereby facilitating the task of distinguishing one resistance range from another.

Figures 3, 4:
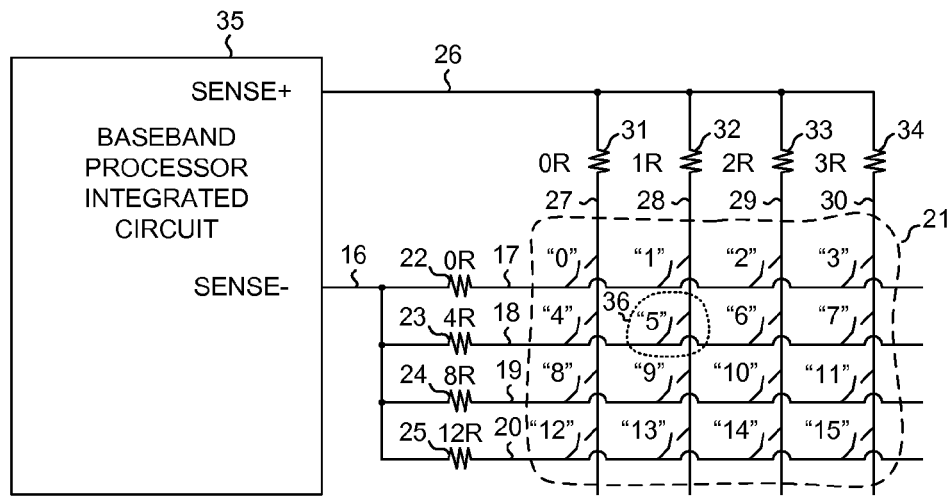
FIG. 3 (Prior Art) is a simplified diagram of a third conventional cellular telephone key scanning circuit.
FIG. 4 (Prior Art) is a table of the resistance between the SENSE+ and SENSE− terminals of the baseband processor integrated circuit of FIG. 3 during different key press conditions.

In the conventional circuit of FIG. 3, it can be difficult to determine which column is selected because the difference in resistance between two neighboring columns can be within the tolerance of the larger row resistors. In the circuit of FIG. 6, however, the resistances of the column resistors are measured independently of the resistances of the row resistors due to diodes 114-117. A digital processor within baseband processor integrated circuit 103 uses the resistance measurement of the first current path and the resistance measurement of the second current path to determine which key of key matrix 101 was pressed.

Figures 8, 9:
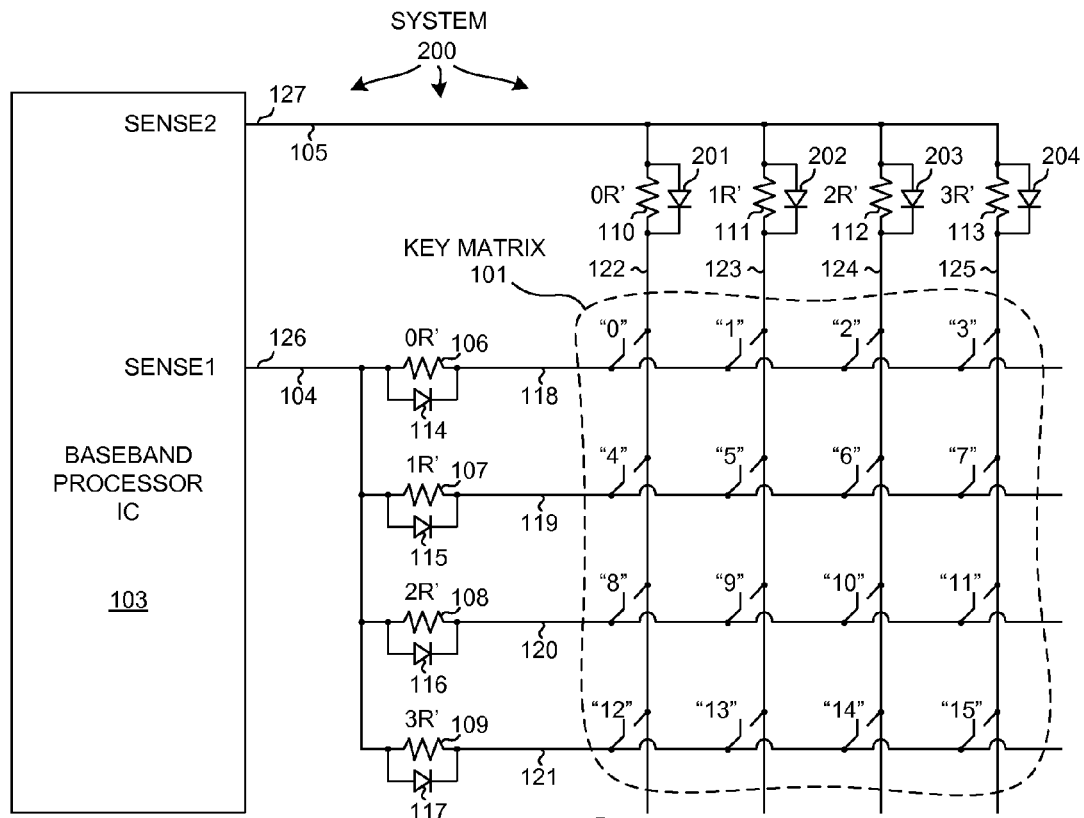
FIG. 8 is a diagram of a second example of a key scanning system within the mobile communication device of FIG. 5.
FIG. 9 is a table that illustrates, for each key that can be pressed on the key matrix of FIG. 8, the corresponding resistances of the first and second current paths.

FIG. 8 is a simplified diagram of a second example of a key scanning system within mobile communication device 100 in accordance with a second novel aspect. Key scanning system 200 has the same general structure as that of system 102 of FIG. 6, except the system 200 of FIG. 8 includes four additional diodes 201-204.

In operation, the low-power sensing circuit within baseband processor integrated circuit 103 places a positive voltage on first common node 104 with respect to second common node 105 as in the embodiment of FIG. 6. If a key is pressed, then the low-power sensing circuit detects a current flow condition and activates the more accurate sensing circuit within baseband processor 103. The more accurate sensing circuit first drives a first current from the SENSE1 terminal 126, through first common node 104, through the key matrix 101, through second common node 105 and to the SENSE2 terminal 127 of the baseband processor integrated circuit 103. Consider the situation in which the user of mobile communication device 100 presses key "5". The more accurate sensing circuit within baseband processor integrated circuit 103 drives a first current through a first current path from SENSE1 terminal 126, through first common node 104, through diode 115, onto row conductor 119, across the closed switch connection made by key "5", onto column conductor 123, through resistor 111, through second common node 105 and to SENSE2 terminal 127. Assuming for simplification purposes that diodes 115 and 202 are ideal diodes, then diode 115 is forward-biased and no current flows through resistor 107. Diode 202 is reverse-biased and no current flows through diode 202. The total resistance of this first current path is therefore 1R'. 1R' is the resistance of resistor 111. The more accurate sensing circuit within baseband processor 103 measures an electrical characteristic of this first current path. In one example, the electrical characteristic is a resistance and the sensing circuit determines that the resistance is 1R'.

After measuring the electrical characteristic of the first current path, the more accurate sensing circuit drives a second current through a second current path from SENSE2 terminal 127, through second common node 105, through diode 202, onto column conductor 123, across the closed switch connection made by key "5", onto row conductor 119, through resistor 107, through first common node 104 and to SENSE1 terminal 126. Assuming again that diodes 202 and 115 are ideal diodes, diode 202 is forward-biased and no current flows through resistor 111. Diode 115 is reverse-biased, so no current flows through diode 115. The resistance of this second current path is therefore 1R'. 1R' is the resistance of resistor 107. The more accurate sensing circuit within baseband processor 103 measures an electrical characteristic of this second current path. In one example, the electrical characteristic is a resistance and the sensing circuit determines that the resistance is 1R'.

Due to the action of diodes 114-117 and 201-204, the resistances of the row resistors 106-109 are measured independently of the resistances of the column resistors 110-113, and the resistances of the column resistors 110-113 are measured independently of the resistances of the row resistors 106-109. In the example where key "5" is pressed, diode 115 shunts the first current around resistor 107 so that the resistance of column resistor 111 is measured independently of the resistance of resistor 107. The sensing circuit must be able to distinguish one of the column resistor values 0R', 1R', 2R' and 3R' from the others to determine which column resistor is involved in the first current path. Similarly, diode 202 shunts the second current around resistor 111 so that the resistance of row resistor 107 is measured independently of the resistance of resistor 111. The sensing circuit must be able to distinguish one of the row resistor values 0R', 1R', 2R' and 3R' from the others to determine which row resistor is involved in the second current path.

FIG. 9 is a table that illustrates, for each key that can be pressed on the key matrix 101 of FIG. 8, the corresponding resistances of the first and second current paths. Note, for example, that FIG. 9 indicates that if the "5" key is pressed then the first current path has a resistance of 1R' and the second current path has a resistance of 1R'. In the table, "R->C" designates current flow from a row conductor to a column conductor and "C->R" designates current flow from a column conductor to a row conductor. Whereas in the embodiment of FIGS. 6 and 7 the more accurate sensing circuit had to be able to sense resistances ranging from approximately zero ohms to approximately 33K ohms, the more accurate sensing circuit in the embodiment of FIGS. 8 and 9 need only be able to sense resistances ranging from approximately zero ohms to approximately 3K ohms (in an example where R' is 1K ohms). Within this 0K to 3K ohm range, it need only be able to determine into which one of four resistance ranges the detected resistance falls. This eases the design requirements on the accurate sensing circuit as compared to the more demanding design requirements on the accurate sensing circuit in the embodiment of FIGS. 6 and 7. Note that examples of FIGS. 6 and 8 employ zero resistance values. In other examples, however, there is no zero resistance value. For example, in FIG. 8 the column resistor values may be 1K ohms, 2K ohms, 3K ohms, and 4K ohms, and the row resistor values may be 1K ohms, 2K ohms, 3K ohms, and 4K ohms.

Although the diodes in the circuits of FIGS. 6 and 8 have been discussed above as being ideal diodes to simplify the explanation of circuit operation, it is understood that the diodes are not ideal but rather are real diodes. The diodes may be silicon diodes, germanium diodes, Schottky diodes, or another type of diode or rectifier element. A real diode has a forward voltage drop and has a non-linear current-to-voltage (IV) characteristic. To reduce power consumption in the key scanning circuitry, it may be desired to keep the first and second currents to small current values. At low currents, however, the resistance of a forward-biased diode may be large enough to interfere with the measurements of the resistances of the row and column resistors of the circuit.

Figures 10, 11:
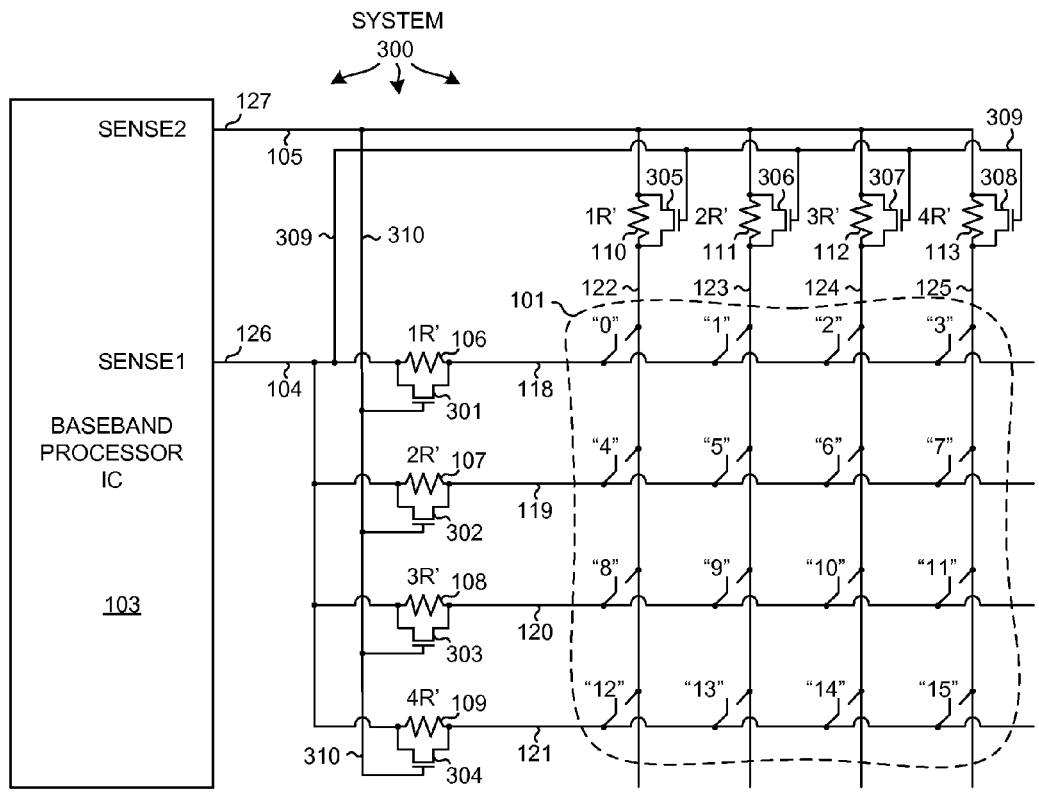
FIG. 10 is a diagram of a third example of a key scanning system within the mobile communication device of FIG. 5.
FIG. 11 is a table that illustrates, for each key that can be pressed on the key matrix of FIG. 10, the corresponding resistances of the first and second current paths.

FIG. 10 is a simplified diagram of a third example of a key scanning system within mobile communication device 100 in accordance with a third novel aspect. Key scanning system 300 has the same general structure as the structure of system 200 of FIG. 8, except that system 300 of FIG. 10 includes eight N-channel field effect transistors 301-308 rather than the eight diodes 114-117 and 201-204 of FIG. 8. The gates of transistors 301-304 are coupled together and are coupled to second common node 105. The gates of transistors 305-308 are coupled together and are coupled to first common node 104.

The embodiment of FIG. 10 operates in a similar manner to the embodiment of FIG. 8, except that when the more accurate sensing circuit within baseband processor 103 places a positive voltage on SENSE1 terminal 126 with respect to SENSE2 terminal 127 during a key press event, the positive voltage on first common node 104 is coupled by conductor 309 to the gates of transistors 305-308. In one embodiment, 2.0 volts is present on the first common node 104 and ground potential is present on the second common node 105. Transistors 305-308 are therefore turned on and are made conductive. The gates of transistors 301-304, on the other hand, are held at ground potential due to their being coupled by conductor 310 to second common node 105. Transistors 301-304 are therefore turned off and are nonconductive. Accordingly, if key "5" is in a pressed state during this condition, then a first current flows from SENSE1 terminal 126, through first common node 104, through resistor 107, through row conductor 119, across the closed switch connection made by key "5", onto column conductor 123, through conductive transistor 306, through second common node 105, and to SENSE2 terminal 127. Conductive transistor 306 shunts the first current around resistor 111. The total resistance of this first current path is the resistance R' of resistor 107. The accurate sensing circuit within baseband processor 103 measures an electrical characteristic (for example, the resistance) of this first current path.

Next, the accurate sensing circuit within baseband processor 103 places a positive voltage on SENSE2 terminal 127 with respect to SENSE1 terminal 126 during the key press event. The positive voltage on second common node 105 is coupled by conductor 310 to the gates of transistors 301-304. 2.0 volts is present on the second common node 105 and ground potential is present on the first common node 104. Transistors 301-304 are therefore turned on and are made conductive. The gates of transistors 305-308, on the other hand, are held at ground potential due to their being coupled by conductor 309 to first common node 104. Transistors 305-308 are therefore turned off and are nonconductive. In the condition described above when key "5" is in a pressed state, a second current flows from SENSE2 terminal 127, through second common node 105, through resistor 111, through column conductor 123, across the closed switch connection made by key "5", onto row conductor 119, through conductive transistor 302, through first common node 104, and to SENSE1 terminal 126. Conductive transistor 302 shunts current around resistor 107. The total resistance of this second current path is the resistance R' of resistor 111. The accurate sensing circuit within baseband processor 103 measures an electrical characteristic (for example, the resistance) of this second current path. The sensing circuit within baseband processor 103 then uses the measurements of the first and second current paths to determine which of the keys of key matrix 101 was pressed.

FIG. 11 is a table that illustrates, for each key that can be pressed on the key matrix 101 of FIG. 10, the corresponding resistances of the first and second current paths. FIG. 11 is the same as FIG. 9. Whereas the diodes 114-117 and 201-204 in FIG. 8 may under low current conditions have large enough forward bias resistances to interfere with the measurements of the first and second current paths, the transistors 106-109 and 305-308 in FIG. 10 are controlled to be substantially conductive or substantially nonconductive. The transistors 106-109 and 305-308 are sized such that their drain-to-source on-resistances (Rds(on)) are very low compared to the resistance value R'. The embodiment of FIG. 10 can therefore be operated using lower magnitudes of the first and second currents than can the embodiment of FIG. 8.

In the embodiments of FIGS. 6, 8 and 10, the resistors and diodes and transistors may be discrete components disposed on a printed circuit board (PCB) or on a flexible printed circuit (FPC) of mobile communication device 100. The resistors and diodes and transistors may be components that are part of key matrix 101. The resistors, diodes and transistors of any one of the embodiments of FIGS. 6, 8 and 10 may, however, be integrated onto an integrated circuit in other embodiments.

Figure 12:
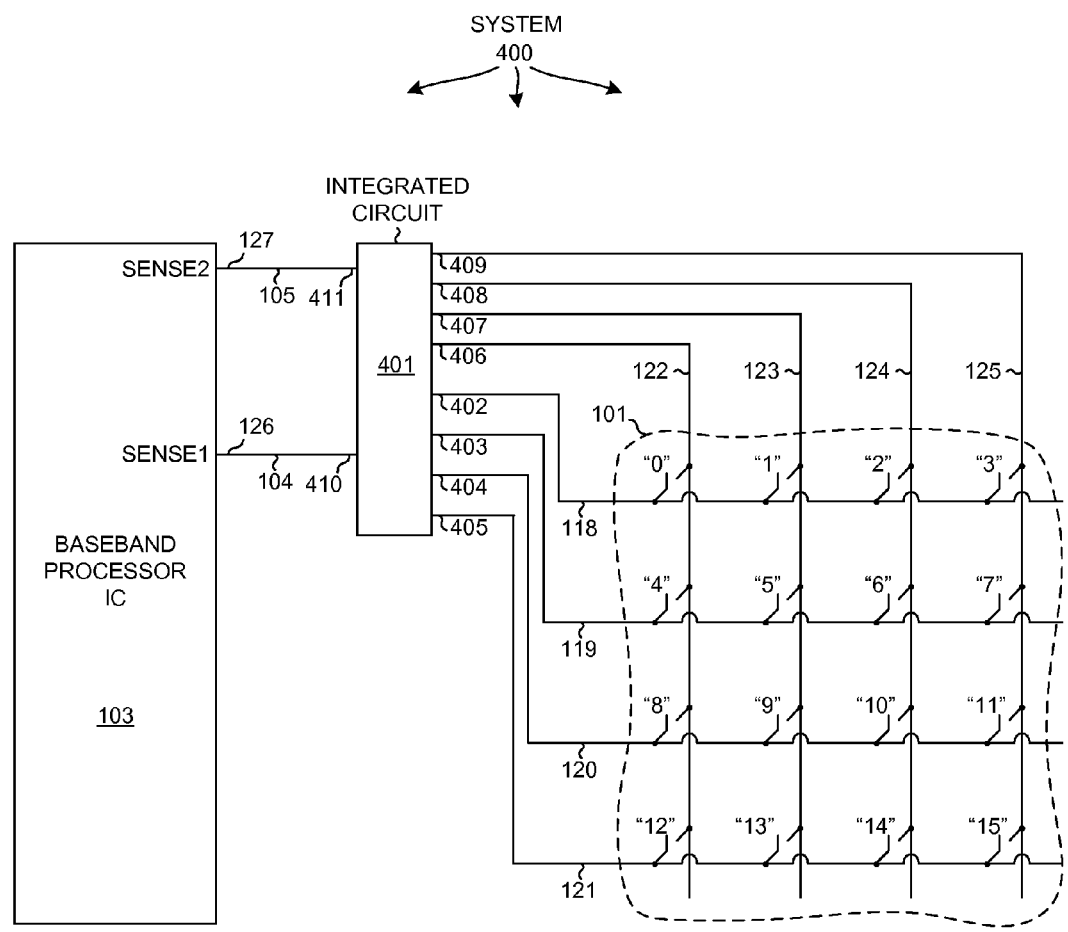
FIG. 12 is a diagram of a fourth example of a key scanning system within the mobile communication device of FIG. 5.
Figure 13:
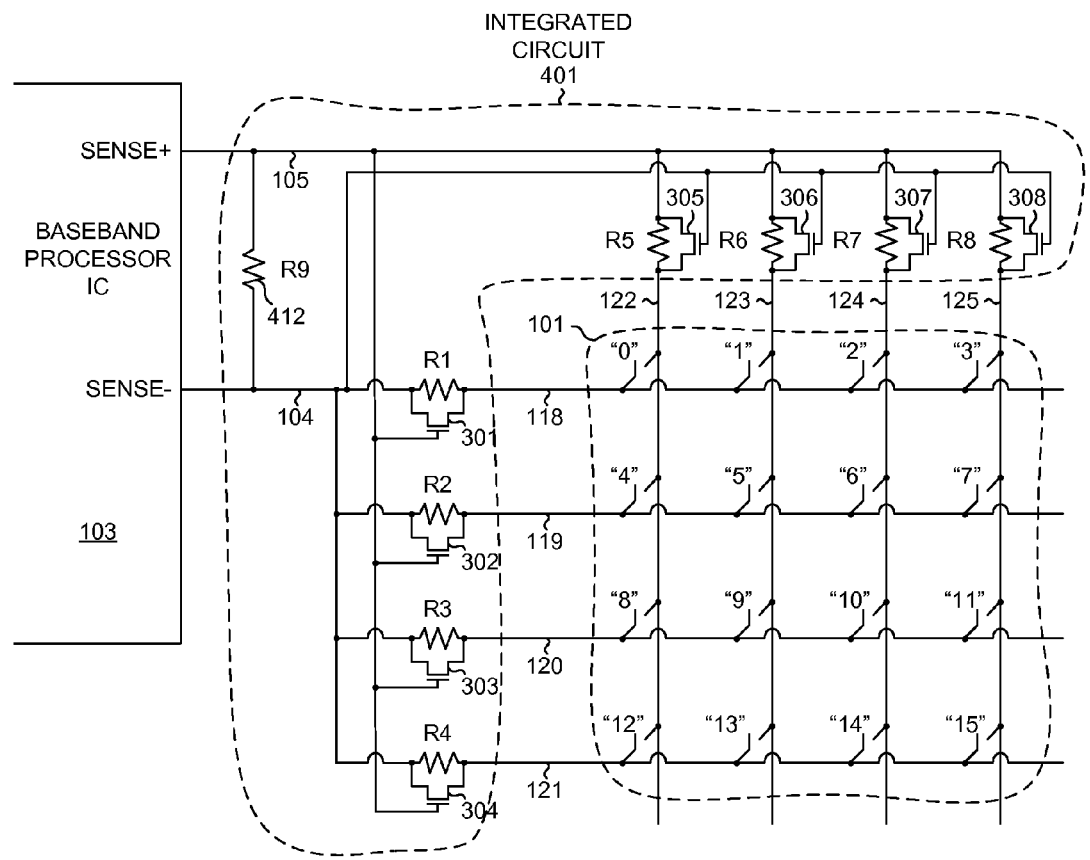
FIG. 13 is a diagram that illustrates the contents of a novel integrated circuit in the fourth example of FIG. 12.

FIG. 12 is a diagram of a fourth example of a key scanning system within mobile communication device 100 in accordance with a fourth novel aspect. In addition to baseband processor integrated circuit 103 and key matrix 101, key scanning system 400 includes a novel integrated circuit 401. FIG. 13 is a diagram that illustrates the contents of novel integrated circuit 401. Novel integrated circuit 401 is fabricated using a standard CMOS semiconductor process and includes one terminal for each of the row conductors 118-121 of key matrix 101. Reference numerals 402-405 in FIG. 12 designate these terminals. Integrated circuit 401 also includes one terminal for each of the column conductor 122-125 of key matrix 101. Reference numerals 406-409 in FIG. 12 designate these terminals. Integrated circuit 401 also has a terminal 410 for coupling to first common node 104 and SENSE1 terminal 126 of the baseband processor integrated circuit 103. Integrated circuit 401 also has a terminal 411 for coupling to second common node 105 and SENSE2 terminal 127 of the baseband processor integrated circuit 103.

As indicated in FIG. 13, the circuitry of integrated circuit 401 is an integration of the resistor and transistor circuitry of the embodiment of FIG. 10, except that an additional reference resistor 412 is provided. A first lead of resistor 412 is coupled to first common node 104 and a second lead of resistor 412 is coupled to second common node 105. In the embodiments of FIGS. 12 and 13 where the resistors are integrated resistors (for example, polysilicon resistors), the relative resistances of the various resistors R1-R9 tend to track each other, but the absolute resistances of the resistors may change over process, voltage and temperature. What is measured by the baseband processor integrated circuit is the actual resistances of the first and second current paths. The sensing circuit within baseband processor 103 therefore measures the resistance of reference resistor 412 during a time when none of the keys is pressed. No current therefore can flow through the key matrix 101 even though various ones of transistors 301-308 may be turned on and conductive. The resistance measured is then used to calibrate the measurements of the first and second currents during key detection operations. Other than the periodic measuring of reference resistance 412 and the associated calibration, the operation of the sensing circuitry within baseband processor integrated circuit 103 is largely the same as in the embodiment of FIG. 10. The resistance of reference resistor 412 in the specific embodiment of FIGS. 12 and 13 is in parallel with the resistances of both the first current path and also the second current path for each key press condition. The resistance of reference resistor 412 therefore affects the magnitudes of the measured resistances, but does not prevent the different resistances in of the first and second current paths to be measured and to be properly distinguished from one another.

Figure 1:
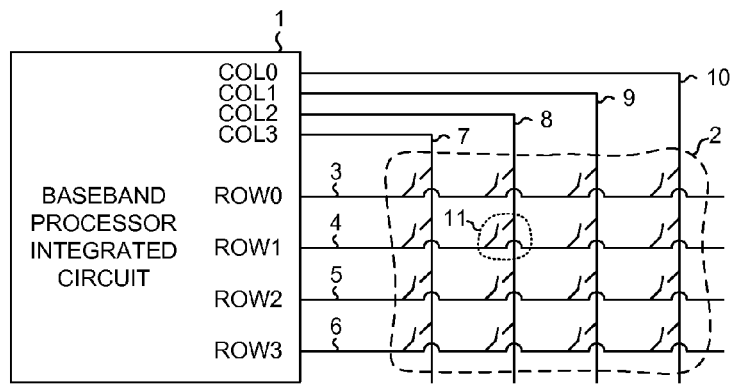
FIG. 1 (Prior Art) is a simplified diagram of a first conventional cellular telephone key scanning circuit.
Figure 2:
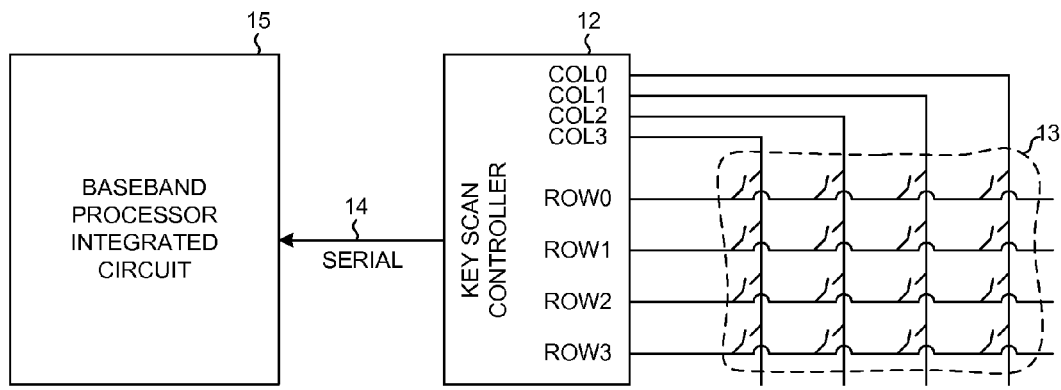
FIG. 2 (Prior Art) is a simplified diagram of second conventional cellular telephone key scanning circuit.

Although providing integrated circuit 401 into mobile communication device 100 involves another integrated circuit and therefore adds an undesirable cost to mobile communication device 100, the manufacturing cost of integrated circuit 401 may be significantly less expensive than the cost of providing a dedicated key scan controller integrated circuit such as key scan controller integrated circuit 12 of FIG. 2. Novel integrated circuit 401 is exceedingly simple, whereas key scan controller integrated circuit 12 typically involves a significant amount of digital logic. An off-the-shelf key scan controller may, for example, be a microcontroller that involves a processor and memory and other interface circuitry. Alternatively, the off-the-shelf key scan controller may involve a dedicated state machine of digital logic and interface circuitry. Such off-the-shelf key scan controllers are more complex, and therefore more expensive to make, than the simple circuitry depicted in FIG. 13. In addition, the suppliers of such off-the-shelf key scan controllers generally make a profit from the sale of their key scan controllers. This profit is translated into high manufacturing costs for the manufacturer of mobile communication device 100. By using novel integrated circuit 401 as an alternative to a common key scan controller, the manufacturer of mobile communication device 100 can reduce the cost of the mobile communication device by the amount of the profit that would otherwise be paid to the key scan controller supplier.

In the description above of the circuits of FIGS. 6, 8 and 10, it has been assumed that the resistors are made to have the precise resistances indicated on the diagrams. When the actual circuits are fabricated, however, the actual resistors have different resistances that fall within a range. The resistance is said to be within a "tolerance". For example, a given resistor that is to have a nominal resistance of 10K ohms, may in fact have a resistance that varies by up to ten percent. Resistors can be obtained whose resistances vary by various tolerances. For example, resistors can be used whose resistances vary by ten percent or less, that vary by five percent or less, that vary by one percent or less. In the embodiment of FIG. 6, the resistors are selected to have values and tolerances such that under all conditions and permutations of actual resistor values, the sensing circuitry within the baseband processor integrated circuit 103 can properly determine through which column resistor the first current flowed and can properly determine through which row resistor the second current flowed. There is no overlap of the actual resistance values of resistors 110-113. There is no overlap between the four groups of second current path resistances of FIG. 7. Similarly, in the embodiment of FIG. 8, resistor values and tolerances are chosen such that there is no overlap between the actual resistances of the row resistors 106-109 and such that there is no overlap between the actual resistances of the column resistors 110-113. Similarly, in the embodiment of FIG. 10, resistor values and tolerances are chosen such that there is no overlap between the actual resistances of the row resistors 106-109 and such that there is no overlap between the actual resistances of the column resistors 110-113.

FIG. 14 is a table that illustrates the ranges of resistances of the first current path and the second current path for each single key press condition in the embodiment of FIGS. 12 and 13. The ranges of resistances are due to the resistors R1-R9 being five percent (5%) resistors. As can be seen from FIG. 14, when a single key is pressed, the resistance of the current path (either the first current path or the second current path) is in one of four nonoverlapping ranges. The first range is 864 to 955 ohms. The second range is 1713-1893 ohms. The third range is 2357-2605 ohms. The fourth range is 3037-3357 ohms. Because none of these four ranges overlaps another, the sensing circuit within baseband processor integrated circuit 103 can properly distinguish a detected resistance in one range from a detected resistance in another range. By determining the ranges to which the first and second current path measurements belong, the sensing circuit identifies the row of the table and from the row identifies the particular key that was pressed.

FIG. 14, however, also illustrates another novel aspect of the embodiment of FIGS. 12 and 13 in that the sensing circuit can determine when two keys have been pressed simultaneously. The bottom twelve rows of the table set forth the different permutations of two keys that can be pressed. For example, the row having the entry "COL 1 AND COL 2" in the "KEY(S) PRESSED" column indicates what resistance range the resistance of the first current path would be in if a key in the first column of keys were pressed at the same time that a key in the second column of keys were pressed. Note that the resistance range of 611-675 ohms does not overlap the resistance range of the first current during a condition of any single key being pressed. Similarly, note that the subsequent rows of FIG. 14 indicate that regardless of which keys in two different columns of keys are pressed, the resistance of the first current path will not overlap the resistance range during a condition of any single key press. Accordingly, if the sensing circuit performs a measurement of the resistance the first current path and detects a resistance not in any one of the resistance ranges corresponding to a single key press (or a no key press) condition, then the sensing circuit determines that two keys have been pressed. Similarly, the bottom six rows of FIG. 14 indicate the resistance ranges of the second current path when two keys in any two rows are pressed simultaneously. Again, the resistance ranges of the second current paths set forth in the last six rows of the table do not overlap any resistance range of the second current path when any single key is pressed. Accordingly, if the sensing circuit performs a measurement of the resistance of the second current path and detects a resistance not in any one of the resistance ranges for a single key press (or a no key press) condition, then the sensing circuit determines that two keys have been pressed.

Figure 15:
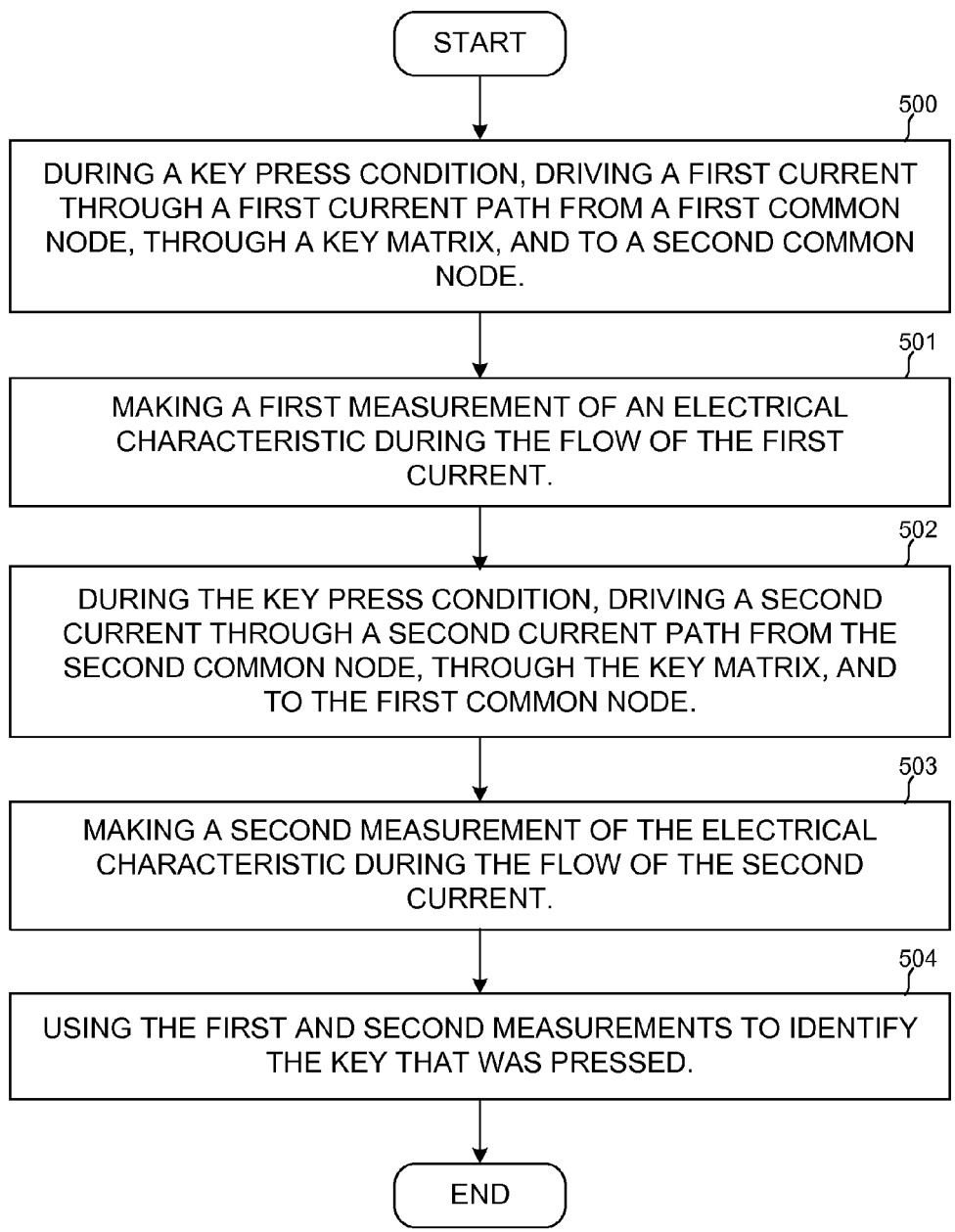
FIG. 15 is a flowchart of a novel method in accordance with another novel aspect.

FIG. 15 is a simplified flowchart of a method in accordance with one novel aspect. During a key press condition, a first current is driven (step 500) through a first current path from a first common node, through a key matrix, and to a second common node. During the flow of this first current, a first measurement of an electrical characteristic is made (step 501). In one example, the electrical characteristic is a resistance of the first current path. Next, during the same key press condition, a second current is driven (step 502) through a second current path from the second common node, through the key matrix, and to the first common node. During the flow of the second current, a second measurement of the electrical characteristic is made (step 503). The results of the first and second measurements are then used (step 504) to identify which key of the key matrix was pressed. In some examples of the method of FIG. 15, if two keys are pressed simultaneously during the taking of the two measurements, then the first and second measurements are used to determine that more than one key was pressed at the same time. In one example of the method of FIG. 15, a two-wire key matrix interface within a baseband processor integrated circuit drives the first and second currents to the key matrix across a two-wire connection, wherein the key matrix includes more than thirty keys. The two-wire key matrix interface and related bidirectional key scanning circuitry need not, however, be used in a baseband processor integrated circuit but rather has broad applicability and can be incorporated as a part of many different types of integrated circuits. The two-wire key matrix interface and related bidirectional key scanning circuitry can be realized in the form of a dedicated key scan controller integrated circuit.

Although certain specific embodiments are described above for instructional purposes, the teachings of this patent document have general applicability and are not limited to the specific embodiments described above. In addition to the methods and circuits described above that involve non-linear non-complex resistance circuits, other similar bidirectional sensing techniques can be used in conjunction with complex non-linear resistance circuits used in the place of the simple non-complex resistances in the embodiments of FIGS. 6, 8, 10 and 13. For example, frequency-band-limiting circuit components can be incorporated into the embodiment of FIG. 3 such that the row impedances and column impedances can be measured independently at different frequencies. Capacitances and/or inductances can be used to allow an impedance of a first electrical component at an end of a row conductor to be measured substantially independently of an impedance of a second electrical component at an end of a column conductor and visa versa. The first and second electrical components can have different frequency-dependent impedances. The first and second currents can flow through the key matrix in the same direction where the non-linear resistance circuits have frequency dependent resistances. For example, at a first frequency a first frequency-dependent impedance shunts current around a first resistor so that the resistance of a second resistor can be measured independently of the resistance of the first resistor. At a second frequency a second frequency-dependent impedance shunts current around the second resistor so that the resistance of the first resistor can be measured independently of the second resistor. At both frequencies, the direction of current flow is the same. Although discrete resistors are described above, the resistors may be provided such that they are integral parts of a printed circuit board (PCB) or flexible printed circuit (FPC) or key matrix or another part of the mobile communication device rather than being discrete components. The order in which the first and second currents is made to flow during a key-press detect operation is not important. The first current can be driven through the key matrix first or the second current can be driven through the key matrix first. Accordingly, various modifications, adaptations, and combinations of the various features of the described specific embodiments can be practiced without departing from the scope of the claims that are set forth below.

What is claimed is:

1. A circuit, comprising:
  a baseband processor integrated circuit comprising a two-wire key matrix interface, a low-power sensing circuit, and a more accurate sensing circuit that is more accurate than the low-power sensing circuit, the low-power sensing circuit comprising:
    a first sense terminal;
    a second sense terminal;
    a sense resistor;
    a current supplying circuit configured to drive a voltage onto the first sense terminal; and
    an analog comparator configured to detect a change across the sense resistor in a current path of an incoming current received in the second sense terminal;
  a two-wire connection coupled to the two-wire key matrix interface of the baseband processor integrated circuit, the two-wire connection having a first connection and a second connection;
  a first common node coupled to the first connection of the two-wire connection;
  a second common node coupled to the second connection of the two-wire connection;
  a second integrated circuit coupled to the first and second connections of the two-wire connection, the second integrated circuit comprising:
    a first resistor having a first lead and a second lead, the first lead being coupled to the first common node;
    a second resistor having a first lead and a second lead, the first lead being coupled to the first common node;
    a third resistor having a first lead and a second lead, the first lead being coupled to the second common node;
    a fourth resistor having a first lead and a second lead, the first lead being coupled to the second common node;
    a first diode having a first lead and a second lead, the first lead being coupled to the first lead of the first resistor, the second lead being coupled to the second lead of the first resistor; and
    a second diode having a first lead and a second lead, the first lead being coupled to the first lead of the second resistor, the second lead being coupled to the second lead of the second resistor; and
  a key matrix coupled to the second integrated circuit, the key matrix comprising a first conductor, a second conductor, a third conductor, a fourth conductor, a first key, a second key, a third key and a fourth key, wherein the first conductor is coupled to the second lead of the first resistor of the second integrated circuit, wherein the second conductor is coupled to the second lead of the second resistor of the second integrated circuit, wherein the third conductor is coupled to the second lead of the third resistor of the second integrated circuit, wherein the fourth conductor is coupled to the second lead of the fourth resistor of the second integrated circuit, wherein a pressing of the first key causes the first conductor to be coupled to the third conductor, wherein a pressing of the second key causes the first conductor to be coupled to the fourth conductor, wherein a pressing of the third key causes the second conductor to be coupled to the third conductor, and wherein the pressing of the fourth key causes the second conductor to be coupled to the fourth conductor;
  wherein the low-power sensing circuit of the baseband processor integrated circuit is configured to drive an initial current from the first common node to the second common node and to detect a key press event by the analog comparator detecting a voltage change across the sense resistor while driving the initial current;
  wherein the more accurate sensing circuit of the baseband processor integrated circuit is configured to provide a first current path by driving a first current from the first common node to the second common in response to a key press event indicated by detection of the voltage change and to measure an electrical characteristic of the first current path, wherein the electrical characteristic of the first current path is the value of resistance in the first current path, and after measuring the electrical characteristic of the first current path, the more accurate sensing circuit drives a second current through a second current path from the second common node to the first common node and measures the electric characteristic of the second path, wherein the electrical characteristic of the second path is the sum of the value of resistance in the first current path and the value of resistance in the second current path;
  wherein the key matrix comprises more than thirty keys;
  wherein the first resistor, the second resistor, the third resistor and the fourth resistor each have resistances such that each of the more than thirty keys can be sensed reliably via the two-wire key matrix interface; and
  wherein the baseband processor integrated circuit is configured to use the first measurement and second measurement to identify the key that was pressed.

2. The circuit of claim 1, wherein the second integrated circuit further comprises:
  a third diode having a first lead a second lead, the first lead being coupled to the first lead of the third resistor, the second lead being coupled to the second lead of the third resistor; and
  a fourth diode having a first lead a second lead, the first lead being coupled to the first lead of the fourth resistor, the second lead being coupled to the second lead of the fourth resistor.

3. The circuit of claim 2, wherein the first resistor has a resistance R1, wherein the second resistor has a resistance R2, wherein the third resistor has a resistance R3, and wherein the fourth resistor has a resistance R4, wherein R2 is greater than R1, wherein R2 is greater than R3, wherein R4 is greater than R1, and wherein R4 is greater than R3.

4. The circuit of claim 2, wherein the circuit further comprises:

means for determining which key of the key matrix was pressed if a single key was pressed, wherein the means drives a first current from the first common node to the second common node and also drives a second current from the second common node to the first common node.

5. The circuit of claim 4, wherein the means is also for differentiating a situation in which two of the keys are pressed from a situation in which a single key is pressed.

6. The circuit of claim 2, and wherein the first resistor, second resistor, third resistor, fourth resistor, first diode, second diode, third diode and fourth diode are integrated onto a single integrated circuit.

7. The circuit of claim 1, wherein the first resistor has a resistance R1, wherein the second resistor has a resistance R2, wherein the third resistor has a resistance R3, and wherein the fourth resistor has a resistance R4, wherein R3 and R4 are substantially different resistances, wherein R1 is greater than R3, wherein R1 is greater than R4, wherein R2 minus R1 is greater than R3, and wherein R2 minus R1 is greater than R4.

8. The circuit of claim 1, wherein the pressing of any single key of the thirty keys causes a current path to exist through the key matrix from the first common node to the second common node if the first common node has a first voltage polarity with respect to the second common node.

9. The circuit of claim 1, wherein the pressing of a key of the thirty keys causes a first current path to exist through the key matrix from the first common node to the second common node if the first common node has a first voltage polarity with respect to the second common node, wherein the first current path has a first resistance, and wherein the pressing of the key also causes a second current path to exist through the key matrix from the second common node to the first common node if the first common node has a second voltage polarity with respect to the second common node, wherein the second current path has a second resistance that is different from the first resistance.

10. The circuit of claim 1, wherein the circuit further comprises:
means for determining which key of the key matrix was pressed if a single key was pressed, wherein the means drives a first current from the first common node to the second common node and also drives a second current from the second common node to the first common node.

11. The circuit of claim 10, wherein the means is also for differentiating a situation in which two of the keys are pressed from a situation in which a single key is pressed.

12. The circuit of claim 1, further comprising:
a fifth resistor having a first lead and a second lead, the first lead being coupled to the first common node, and second resistor being coupled to the second common node.

13. The circuit of claim 1, wherein the first resistor, second resistor, third resistor, fourth resistor, first diode and second diode are integrated onto a single integrated circuit.

14. A circuit comprising:
a baseband processor integrated circuit comprising a two-wire key matrix interface, a low-power sensing circuit, and a more accurate sensing circuit that is more accurate than the low-power sensing circuit, the low-power sensing circuit comprising:
  a first sense terminal;
  a second sense terminal;
  a sense resistor;
  a current supplying circuit configured to drive a voltage onto the first sense terminal; and
  an analog comparator configured to detect a change across the sense resistor in a current path of an incoming current received in the second sense terminal;
a two-wire connection coupled to the two-wire key matrix interface of the baseband processor integrated circuit, the two-wire connection having a first connection and a second connection;
a first common node coupled to the first connection of the two-wire connection;
a second common node coupled to the second connection of the two-wire connection;
a second integrated circuit coupled to the first and second connections of the two-wire connection, the second integrated circuit comprising:
  a first resistor having a first lead and a second lead, the first lead being coupled to the first common node;
  a second resistor having a first lead and a second lead, the first lead being coupled to the first common node;
  a third resistor having a first lead and a second lead, the first lead being coupled to the second common node;
  a fourth resistor having a first lead and a second lead, the first lead being coupled to the second common node;
  a first transistor having a first lead a second lead, the first lead being coupled to the first lead of the first resistor, the second lead being coupled to the second lead of the first resistor;
  a second transistor having a first lead a second lead, the first lead being coupled to the first lead of the second resistor, the second lead being coupled to the second lead of the second resistor; and
a key matrix coupled to the second integrated circuit, the key matrix comprising a first conductor, a second conductor, a third conductor, a fourth conductor, a first key, a second key, a third key and a fourth key, wherein the first conductor is coupled to the second lead of the first resistor of the second integrated circuit, wherein the second conductor is coupled to the second lead of the second resistor of the second integrated circuit, wherein the third conductor is coupled to the second lead of the third resistor of the second integrated circuit, wherein the fourth conductor is coupled to the second lead of the fourth resistor of the second integrated circuit, wherein a pressing of the first key causes the first conductor to be coupled to the third conductor, wherein a pressing of the second key causes the first conductor to be coupled to the fourth conductor, wherein a pressing of the third key causes the second conductor to be coupled to the third conductor, and wherein the pressing of the fourth key causes the second conductor to be coupled to the fourth conductor,
wherein the low-power sensing circuit of the baseband processor integrated circuit is configured to drive an initial current from the first common node to the second common node and to detect a key press event by the analog comparator detecting a voltage change across the sense resistor while driving the initial current;
wherein the key matrix comprises more than thirty keys,
wherein when a key press event involving any single key of the thirty keys is detected by the low-power sensing circuit, the more accurate sensing circuit causes a first current path and a second current path to extend through the key matrix at different times between the first common node and the second common node,
wherein the more accurate sensing circuit of the baseband processor integrated circuit is configured to provide a first current path by driving a first current from the first common node to the second common in response to a key press event indicated by detection of the voltage change and to measure an electrical characteristic of the first current path, wherein the electrical characteristic of the first current path is the value of resistance in the first current path, and after measuring the electrical characteristic of the first current path, the more accurate sensing circuit drives a second current through a second current path from the second common node to the first common node and measures the electric characteristic of the second path, wherein the electrical characteristic of the second path is the sum of the value of resistance in the first current path and the value of resistance in the second current path;

wherein the baseband processor integrated circuit is configured to use the first measurement and second measurement to identify the key that was pressed; and wherein the first resistor, the second resistor, the third resistor and the fourth resistor each have resistances such that each of the more than thirty keys can be sensed reliably via the two-wire key matrix interface.

15. The circuit of claim 14, wherein the second integrated circuit further comprises:
a third transistor having a first lead and a second lead, the first lead being coupled to the first lead of the third resistor, the second lead being coupled to the second lead of the third resistor; and
a fourth transistor having a first lead a second lead, the first lead being coupled to the first lead of the fourth resistor, the second lead being coupled to the second lead of the fourth resistor.

16. The circuit of claim 15, wherein the first transistor has a control input lead, wherein the second transistor has a control input lead, wherein the control input leads of the first and second transistors are coupled together and are also coupled to the second common node, wherein the third transistor has a control input lead, wherein the fourth transistor has a control input lead, wherein the control input leads of the third and fourth transistors are coupled together and are also coupled to the first common node.

17. The circuit of claim 15, wherein the first resistor has a resistance R1, wherein the second resistor has a resistance R2, wherein the third resistor has a resistance R3, and wherein the fourth resistor has a resistance R4, wherein R2 is greater than R1, wherein R2 is greater than R3, wherein R4 is greater than R1, and wherein R4 is greater than R3.

18. The circuit of claim 14, wherein the first transistor has a control input lead, wherein the second transistor has a control input lead, wherein the control input leads of the first and second transistors are coupled together and are also coupled to the second common node.

19. The circuit of claim 14, wherein the first resistor has a resistance R1, wherein the second resistor has a resistance R2, wherein the third resistor has a resistance R3, and wherein the fourth resistor has a resistance R4, wherein R3 and R4 and substantially different resistances, wherein R1 is greater than both R3 and R4, wherein R2 minus R1 is greater than R3, and wherein R2 minus R1 is greater than R4.

20. The circuit of claim 14, further comprising:
a circuitry that determines the identity of a key that is pressed if a single key is pressed, and that can distinguish a situation in which two keys are pressed from a situation in which a single key is pressed.

21. A circuit, comprising:
a baseband processor integrated circuit configured to detect when two keys on a key matrix are pressed simultaneously, the baseband processor integrated circuit comprising a two-wire key matrix interface, a low-power sensing circuit configured to detect a key press event, and a more accurate sensing circuit that is more accurate than the low-power sensing circuit, the low-power sensing circuit comprising:
a first sense terminal;
a second sense terminal;
a sense resistor;
a current supplying circuit configured to drive a voltage onto the first sense terminal; and
an analog comparator configured to detect a change across the sense resistor in a current path of an incoming current received in the second sense terminal, the change across the sense resistor indicating detection of the key press event;
a two-wire connection coupled to the two-wire key matrix interface of the baseband processor integrated circuit, the two-wire connection having a first connection and a second connection;
a second integrated circuit coupled to the first and second connections of the two-wire connection, the second integrated circuit comprising:
a reference resistor coupled to a first common node and a second common node, the first common node being coupled to the first connection of the two-wire connection, the second common node being coupled to the second connection of the two-wire connection;
a first resistor having a first lead and a second lead, the first lead being coupled to the first common node;
a second resistor having a first lead and a second lead, the first lead being coupled to the first common node;
a third resistor having a first lead and a second lead, the first lead being coupled to the second common node;
a fourth resistor having a first lead and a second lead, the first lead being coupled to the second common node;
a first transistor comprising a source coupled to the first lead of the first resistor, a drain coupled to the second lead of the first resistor, and a gate coupled to the second common node;
a second transistor comprising a source coupled to the first lead of the second resistor, a drain coupled to the second lead of the second resistor, and a gate coupled to the second common node;
a third transistor comprising a source coupled to the first lead of the third resistor, a drain coupled to the second lead of the third resistor, and a gate coupled to the first common node; and
a fourth transistor comprising a source coupled to the first lead of the fourth resistor, a drain coupled to the second lead of the fourth resistor, and a gate coupled to the first common node; and
a key matrix coupled to the second integrated circuit, the key matrix comprising:
a first conductor coupled to the second lead of the first resistor;
a second conductor coupled to the second lead of the second resistor;
a third conductor coupled to the second lead of the third resistor;
a fourth conductor coupled to the second lead of the fourth resistor;
a first key configured such that a pressing of the first key causes the first conductor to be coupled to the third conductor;
a second key configured such that a pressing of the second key causes the first conductor to be coupled to the fourth conductor;
a third key configured such that a pressing of the third key causes the second conductor to be coupled to the third conductor; and a fourth key configured such that a pressing of the fourth key causes the second conductor to be coupled to the fourth conductor;

wherein the more accurate sensing circuit of the baseband processor integrated circuit is configured to provide a first current path by driving a first current from the first common node to the second common in response to a key press event and to measure an electrical characteristic of the first current path, wherein the electrical characteristic of the first current path is the value of resistance in the first current path, and after measuring the electrical characteristic of the first current path, the more accurate sensing circuit drives a second current through a second current path from the second common node to the first common node and measures the electric characteristic of the second path, wherein the electrical characteristic of the second path is the sum of the value of resistance in the first current path and the value of resistance in the second current path; and wherein the baseband processor integrated circuit is configured to use the first measurement and second measurement to identify the key that was pressed.

22. The circuit of claim 21, wherein the second integrated circuit is configured such that the first resistor, the second resistor, the third resistor and the fourth resistor each have resistances such that each of the more than thirty keys can be sensed reliably via the two-wire key matrix interface.

23. The circuit of claim 22, wherein a baseband processor integrated circuit further comprises a more accurate sensing circuit configured to place a positive voltage on first sense terminal with respect to the second sense terminal during a key press event.

24. The circuit of claim 23, wherein placing a positive voltage on first sense terminal causes a positive voltage to be placed on the first common node of the integrated circuit and a ground voltage to be placed on the second common node of the second integrated circuit such that a positive voltage is applied the gates of the third and fourth transistors and a ground voltage is applied the gates of the first and second transistors such that the third and fourth transistors are turned on and made conductive and the first and second transistors are turned off and made nonconductive.

25. The circuit of claim 24, wherein the circuit is configured such that the key press event causes a first current to flow from the first sense terminal of the baseband processor integrated circuit, across the first connection of the two-wire connection, through the first common node of the second integrated circuit, through the second resistor of the second integrated circuit, onto the second conductor of the key matrix, across a closed switch connection in the key matrix, onto the fourth conductor of the key matrix, through the fourth transistor of the second integrated circuit, through the second common node of the second integrated circuit, across the second connection of the two-wire connection and to the second sense terminal of the baseband processor integrated circuit.

26. The circuit of claim 25, wherein the more accurate sensing circuit of the baseband processor integrated circuit is further configured to receive the first current flow and measure an electrical characteristic of first current path at the second sense terminal, and to cause a second current to flow based on measuring the electrical characteristic of the first current flow.

27. The circuit of claim 26, wherein causing a second current to flow based on measuring the electrical characteristic of the first current flow comprises placing a positive voltage on the second sense terminal to cause a positive voltage to be placed on the second common node of the second integrated circuit and a ground voltage to be placed on the first common node of the integrated circuit such that a positive voltage is applied the gates of the first and second transistors and a ground voltage is applied the gates of the third and fourth transistors such that the first and second transistors are turned on and made conductive and the third and fourth transistors are turned off and made non-conductive.

28. The circuit of claim 27, wherein causing a second current to flow based on measuring the electrical characteristic of the first current flow further comprises causing the second current to flow from the second sense terminal, across the second connection of the two-wire connection, through the second common node of the second integrated circuit, through the fourth resistor of the second integrated circuit, onto the fourth conductor of the key matrix, across the closed switch connection in the key matrix, onto the second conductor of the key matrix, through the second transistor of the second integrated circuit, across the first connection of the two-wire connection to the first sense terminal of the baseband processor integrated circuit.

* * * * *